United States Patent
Davis

(10) Patent No.: US 7,067,018 B2
(45) Date of Patent: Jun. 27, 2006

(54) AUTOMATED SYSTEM FOR HANDLING AND PROCESSING WAFERS WITHIN A CARRIER

(75) Inventor: Jeffry Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 293 days.

(21) Appl. No.: 10/200,074

(22) Filed: Jul. 19, 2002

(65) Prior Publication Data

US 2003/0051973 A1    Mar. 20, 2003

Related U.S. Application Data

(63) Continuation-in-part of application No. 09/612,009, filed on Jul. 7, 2000, which is a continuation-in-part of application No. 09/274,511, filed on Mar. 23, 1999, now Pat. No. 6,279,724, which is a continuation-in-part of application No. 09/112,259, filed on Jul. 8, 1998, now Pat. No. 6,273,110, which is a continuation-in-part of application No. 08/994,737, filed on Dec. 19, 1997, now Pat. No. 6,447,232, which is a continuation-in-part of application No. 08/851,480, filed on May 5, 1997, now abandoned.

(51) Int. Cl.
*B08B 3/02* (2006.01)

(52) U.S. Cl. ............... 134/33; 414/416.11; 414/938

(58) Field of Classification Search .......... 414/416.02, 414/416.11, 938, 937, 939, 940; 134/33
See application file for complete search history.

(56) References Cited

U.S. PATENT DOCUMENTS

| | | | | |
|---|---|---|---|---|
| 4,778,382 A | * | 10/1988 | Sakashita | 432/239 |
| 4,872,799 A | * | 10/1989 | Fisher, Jr. | 414/180 |
| 5,131,799 A | * | 7/1992 | Nishi et al. | 414/416.09 |
| 5,180,273 A | * | 1/1993 | Sakaya et al. | 414/404 |
| 5,227,001 A | * | 7/1993 | Tamaki et al. | 156/345.22 |
| 5,232,328 A | * | 8/1993 | Owczarz et al. | 414/590 |
| 5,299,901 A | * | 4/1994 | Takayama | 414/404 |
| 5,339,539 A | | 8/1994 | Shiraishi et al. | |
| 5,544,421 A | | 8/1996 | Thompson et al. | |
| 5,784,797 A | | 7/1998 | Curtis et al. | |
| 5,887,604 A | * | 3/1999 | Murakami et al. | 134/102.2 |
| 6,092,981 A | * | 7/2000 | Pfeiffer et al. | 414/810 |
| 6,279,724 B1 | | 8/2001 | Davis | |
| 6,532,975 B1 | * | 3/2003 | Kamikawa et al. | 134/61 |
| 6,776,173 B1 | * | 8/2004 | Kamikawa | 134/57 R |

* cited by examiner

*Primary Examiner*—Thomas J. Brahan
(74) *Attorney, Agent, or Firm*—Perkins Coie LLP

(57) ABSTRACT

A workpiece handling and processing system has a interface section for loading wafers from cassettes into carriers. The wafers are lifted out of cassettes by a buffer elevator and moved into a position over an open carrier by a buffer robot. A comb elevator lifts combs entirely through the open cassette, to transfer the wafers from the buffer robot into the carrier. A process robot moves loaded carriers from the interface section to one or more process chambers in a process section. The advantages of processing wafers within a carrier are achieved within a compact space and with high throughput.

3 Claims, 17 Drawing Sheets

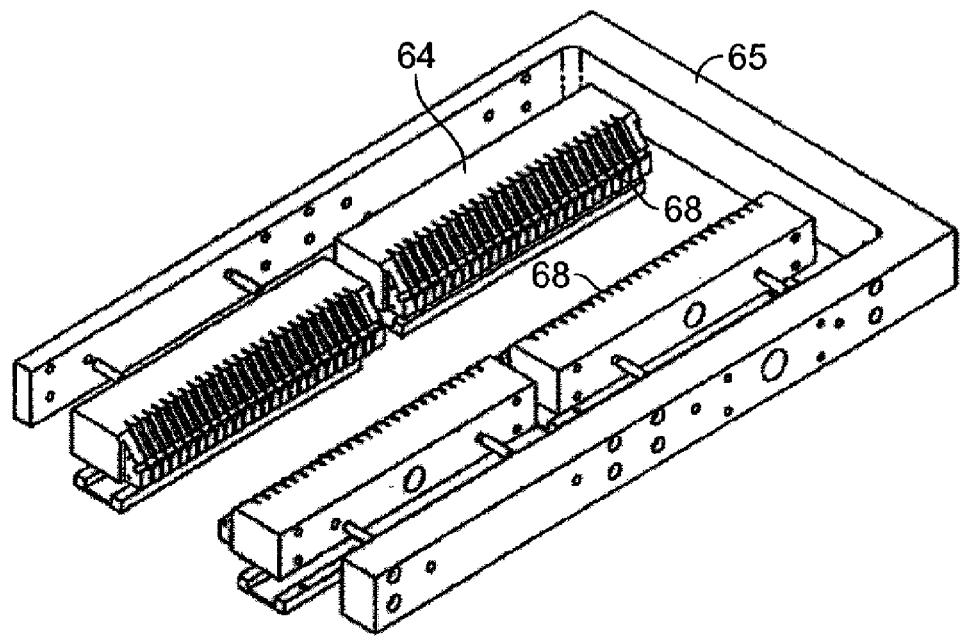
*Fig. 13*
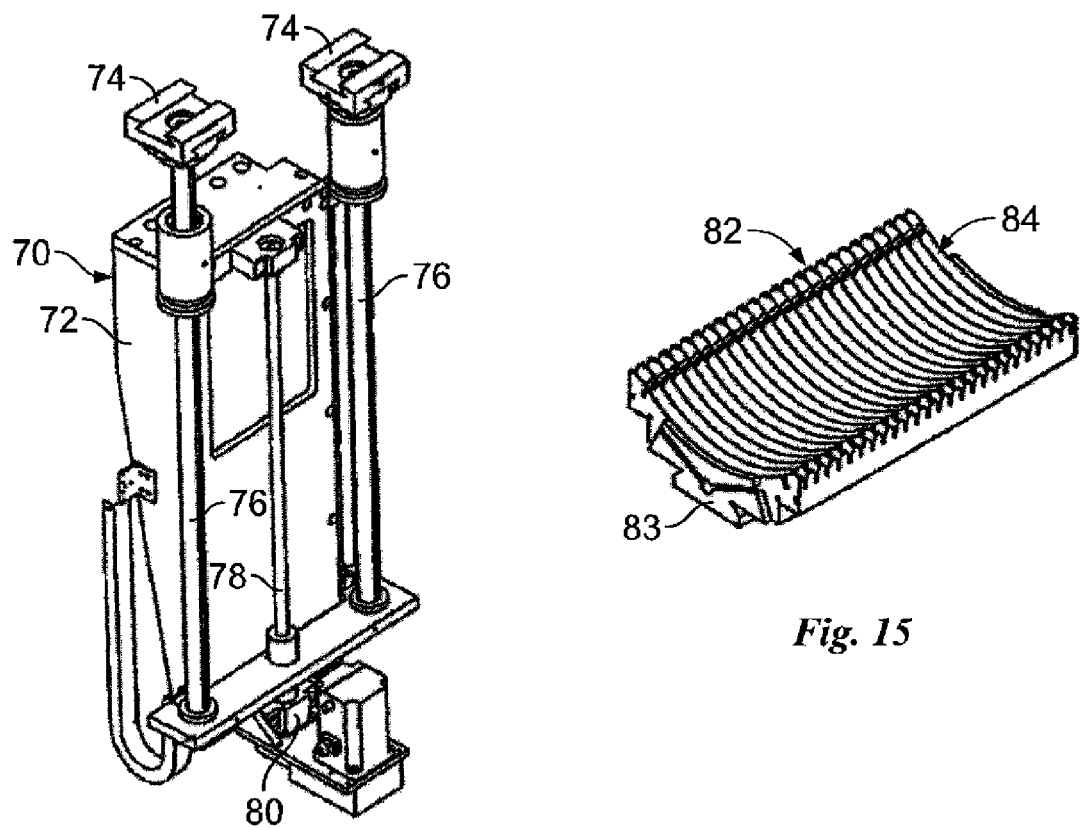
*Fig. 14*
*Fig. 15*

AUTOMATED SYSTEM FOR HANDLING AND PROCESSING WAFERS WITHIN A CARRIER

This application is a continuation-in-part of U.S. patent application Ser. No. 09/612,009, filed Jul. 7, 2000, and now pending, which is a continuation-in-part of U.S. patent application Ser. No. 09/274,511, filed Mar. 23, 1999 and now U.S. Pat. No. 6,279,724, which is a continuation-in-part of U.S. patent application Ser. No. 09/112,259, filed Jul. 8, 1998, and now U.S. Pat. No. 6,273,110, which is a continuation-in-part of U.S. patent application Ser. No. 08/994,737, filed Dec. 19, 1997 now U.S. Pat. No. 6,447,232, which is a continuation-in-part of U.S. patent application Ser. No. 08/851,480, filed May 5, 1997 and now abandoned. Priority to these applications is claimed under 35 USC § 120, and these applications are incorporated herein by reference.

BACKGROUND OF THE INVENTION

The field of the invention is processing semiconductor wafers and similar flat articles or workpieces, such as memory media, optical media and masks, micro-electronic or micro-mechanical substrates, and similar flat workpieces, collectively referred to here as wafers.

Wafer processing requires a very clean environment, as even low levels of contaminants or microscopic contaminant particles can degrade or destroy performance of the wafer end products, which are typically micro-electronic products. Various systems and methods have been developed for handling and processing wafers, while attempting to minimize the potential for contamination or damage to the wafers.

Various manufacturing steps involve spraying process liquids and/or gases onto the wafers. The process chemicals are often sprayed onto the wafers while the wafers are spinning, to assist in distribution of the chemicals over the wafer surfaces. With this type of processing, the amount of structure or material between the wafers and the spray nozzles is advantageously minimized, so that the spray nozzles can spray process chemicals directly onto the wafers, through or past a minimum amount of obstructions. On the other hand, at least some supporting structure is required to support the wafers during processing. During stationary processing, at a minimum, the wafers must, of course, be supported from below. During spin processing, the wafers must be supported from both above and below, or on opposite sides, to avoid excessive wafer movement within the rotor or other wafer holder, as the wafers rotate.

To meet these needs, centrifugal or spin processors have included rotors with large open areas, to reduce blocking or obstructing the process chemicals sprayed towards the wafers.

On the other hand, during movement of the wafers into, out of or between process chambers or storage positions, having additional structure around the wafers is advantageous, to better protect the wafers from physical damage, or to protect a single wafer within a batch or array of wafers, from potential damage by a misplaced or broken adjacent wafer. Consequently, these competing or contrary requirements present engineering challenges in the design of wafer processing systems and methods. As wafer processing ordinarily is performed in a clean room, the processing system advantageously is compact, to reduce space and manufacturing costs. Accordingly, it is an object of the invention to provide an improved system and methods for handling wafers, and for processing wafers. Other objects, features and advantages will appear below.

SUMMARY OF THE INVENTION

In a first aspect of the invention, a workpiece or wafer processing or handling system includes a wafer container intake or interface section. A wafer buffer elevator in the intake section is positioned to move wafers out of a wafer container, such as a cassette. A buffer robot moves the wafers to a carrier loader. A carrier loading elevator extends up through a carrier to receive the wafers from the buffer robot. The carrier loading elevator then moves the wafers down into the carrier. The wafers are then ready for processing or handling within the carrier. Processing the wafers within the carrier helps to protect the wafers from damage during processing and movement. In addition, although the wafers are closely spaced together within the carrier, the carrier helps to reduce the potential damage to wafers adjacent to a broker wafer within the carrier.

In a second aspect, the system includes an indexer for temporarily holding wafer containers, and for moving wafer containers within the interface or intake section of the system. Wafer containers or cassettes are loaded at a front or first end of the indexer, moved on the indexer to a wafer transfer position, wherein the wafers are removed from the wafer container, for placement into a carrier adapted to be placed with the wafers into a centrifugal or immersion process chamber. A shuttle robot or subsystem extends alongside the indexer, for moving carriers between a process robot adjacent to the front end of the indexer, and the carrier loader adjacent the back end of the indexer. As a result, the system is highly compact and occupies a relatively small footprint. Thus, the amount of clean room space needed for the system is minimized. The construction, operation and maintenance costs for clean room space may consequently be reduced.

In a third aspect, the system includes a carrier loader having shelves or carrier holders. Multiple carriers, unloaded or loaded with wafers, may be accommodated in the carrier loader. A carrier loader robot is movable among the carrier shelves or carrier storage positions in the carrier loader. Preferably, the wafer capacity of the carrier loader matches the wafer capacity of the indexer. The system accordingly has random access to any batch of wafers. Through the interaction of the indexer and the carrier loader, wafers in any container can be input, processed, and output, in any sequence.

The invention resides as well in subsystems, subcomponents and method steps, including, for example, the carrier loader, buffer robot, and shuttle robot, and their subsystems and components.

BRIEF DESCRIPTION OF THE DRAWINGS

While the drawings show a single embodiment, various changes and substitutions may of course be made within the scope of the invention. In the drawings, wherein the same reference number indicates the same element, in each of the views:

FIG. 13 is a perspective view of the buffer robot combs.

FIG. 14 is a perspective view of the buffer elevator.

FIG. 15 is a perspective view of the buffer elevator head tray.

DETAILED DESCRIPTION OF THE DRAWINGS

Figure 1:
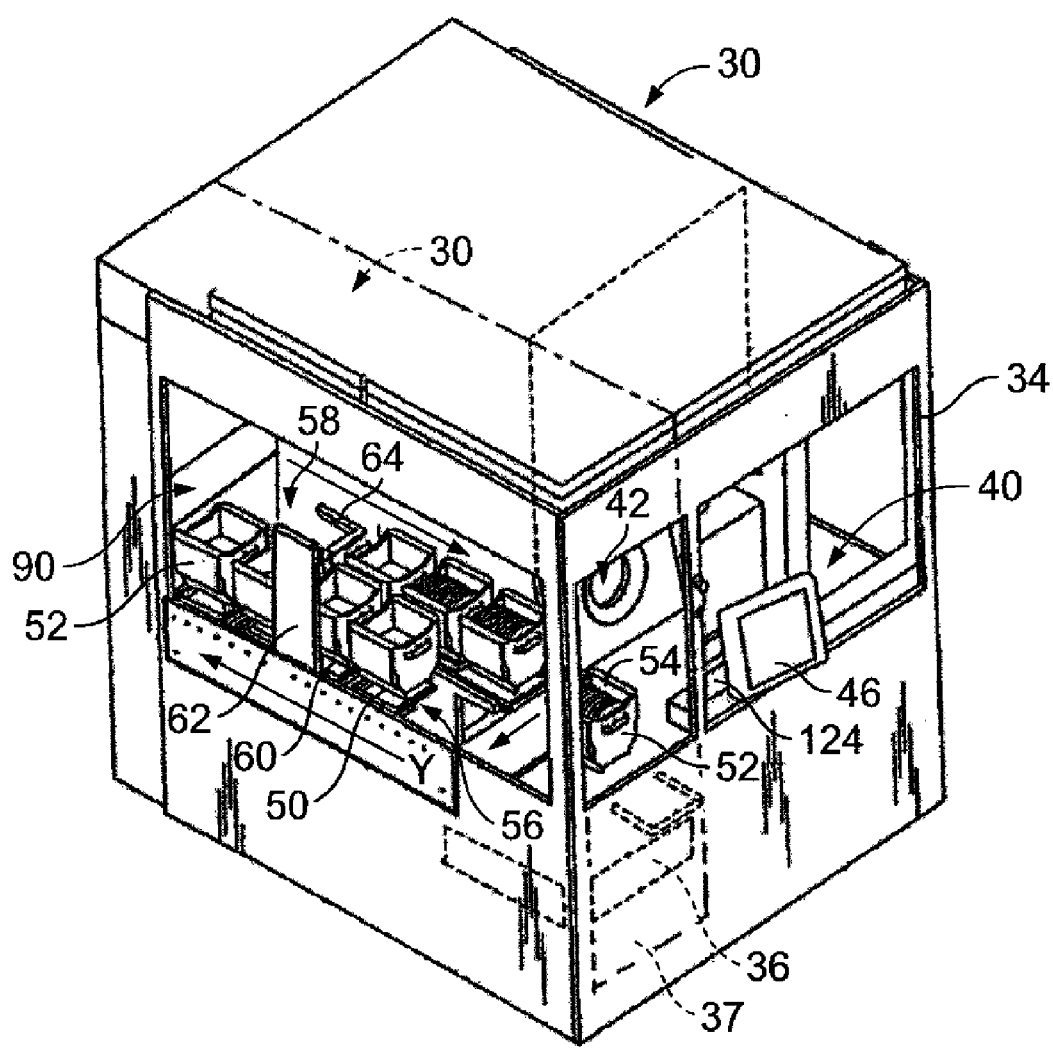
FIG. 1 is a front top and left side perspective view of the system of the invention.
Figure 2:
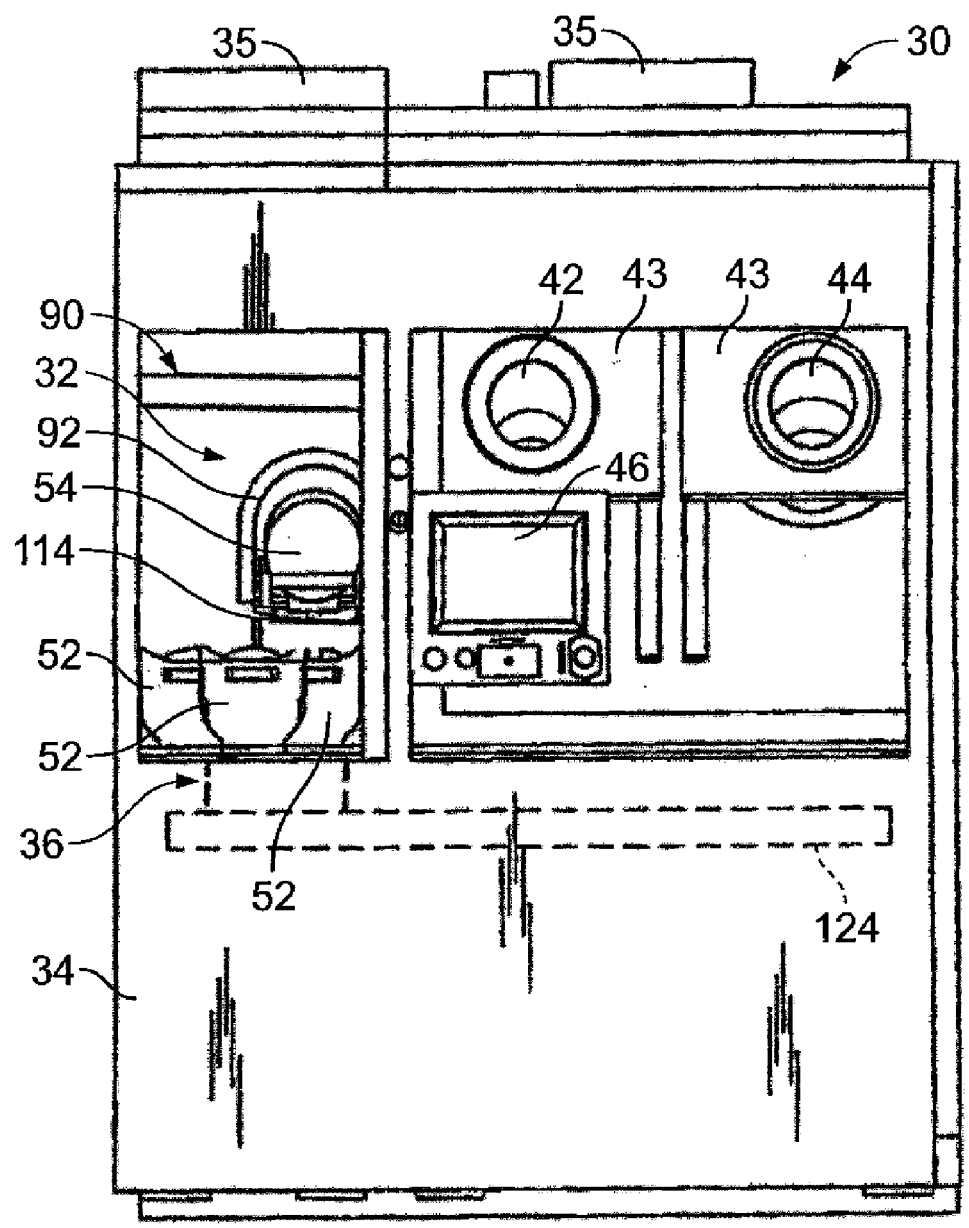
FIG. 2 is a front view of the system shown in FIG. 1.

Turning now in detail to the drawings, as shown in FIGS. 1 and 2, a wafer or workpiece processing and handling system 30 has an input or interface module, section or subsystem 32 and a process section 40 within a enclosure 34. A computer/controller 46 controls operation of the system 30 and its various subsystems, and optionally displays corresponding information. The process section or module 40 has one or more process chambers. In the embodiment shown in FIG. 2, a first process chamber 42 and a second process chamber 44 are shown. Each process chamber 42 and 44 has a process chamber door 43, which is opened to load and unload the process chambers, and which is closed during processing. The processing chambers 42 and 44 are preferably centrifugal or spin process chambers having a rotor which holds a carrier containing wafers. Other types of process chambers may also be used, for example, immersion process chambers, as described, for example, in U.S. patent application Ser. No. 10/200,075, filed Jul. 19, 2002 and incorporated herein by reference. Air inlets 35 on the top of the enclosure 34 advantageously provide a continuous downward flow of air through the system 30, to help reduce the potential for contaminant particles on the wafers or workpieces being processed.

Figure 3:
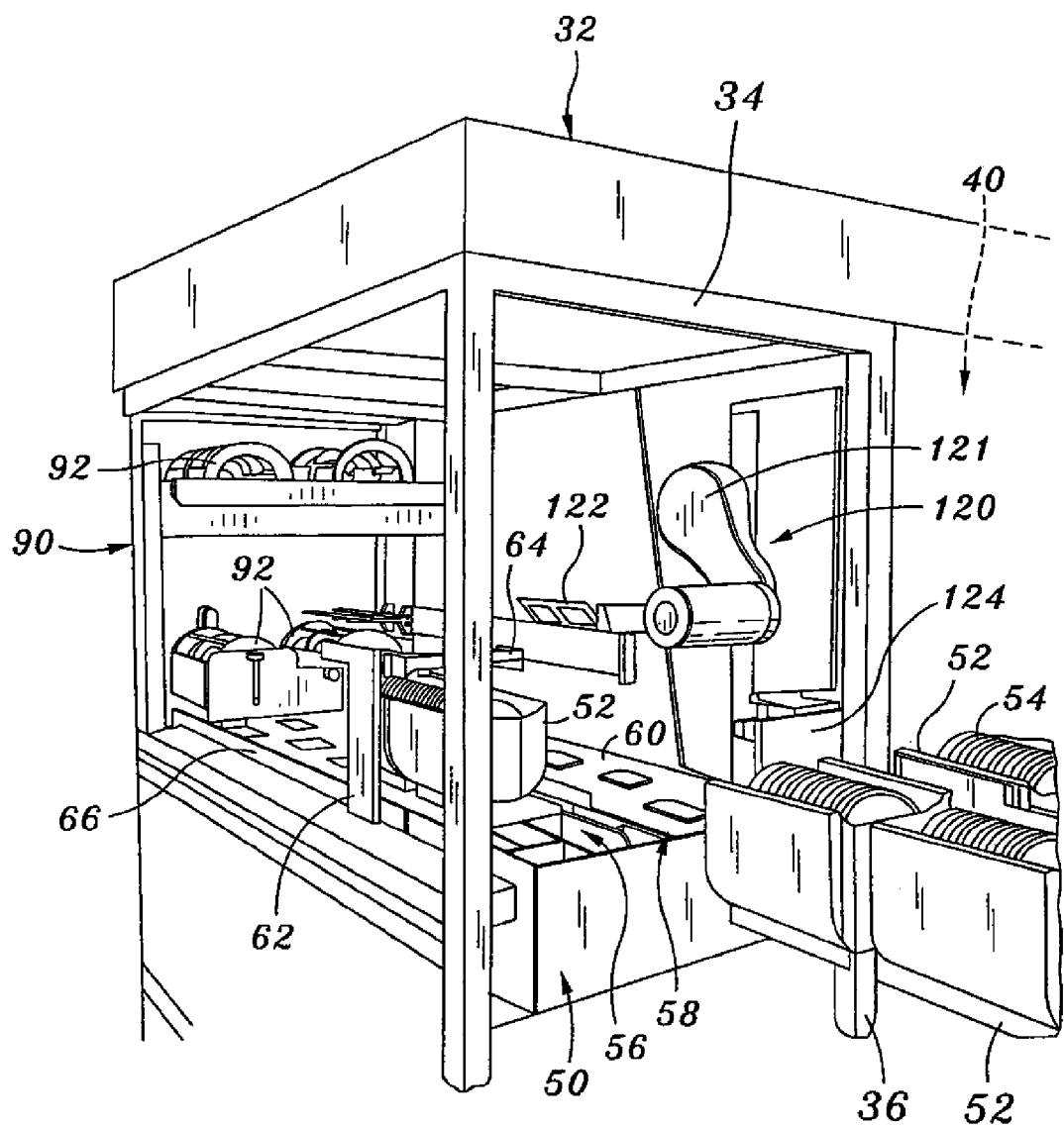
FIG. 3 is a front and left side perspective view of the interface or input section shown in FIG. 1, at the initial loading of the indexer.

Referring now to FIGS. 1, 2 and 3, wafers 54 held within cassettes or other containers 52 are loaded into the system 30, manually, or via a factory robot. The cassettes 52 have grooves or slots for holding an array or batch of wafers 54. The cassettes 52 are open on the bottom and the top, so that the wafers 54 can be lifted up and out of the cassettes 52. The wafers 54, as shown in FIG. 3, are 200 mm diameter, although other sizes may also be processed.

As shown in FIG. 1, a window 37 in the enclosure 34 temporarily opens while cassettes 52 are moved into the enclosure and placed on the robotic loader 36. The window 37 is otherwise ordinarily in the up or closed position, to maintain continuity of the enclosure 34, as well as air flow down through the enclosure 34, to reduce potential for contamination.

Referring to FIGS. 1–3 and 12, and indexer 50 receives cassettes 52 from the loader 36. The indexer 50 has a first row 56 and a second 58 of cassette positions. Cassette platforms 60 are supported indexer conveyor belts 51, at each of the cassette positions, except at diagonally opposite corners of the indexer 50. The cassettes 52 move on the indexer 50 through the cassette positions by driving the conveyor belts 51, in each of the rows 56 and 58. A row shifter 53 shifts cassettes 52 between the rows 56 and 58, by lifting the cassette platform 60 up, over and down. Description of the design and operation of the indexer is in U.S. Pat. No. 6,279,724, incorporated herein by reference.

Turning to FIGS. 3–5 and 13, a buffer robot 62 is movable longitudinally (front to back) on a buffer rail 66 alongside and parallel with the indexer rows, in the interface section 32. Buffer wafer combs 64 supported on a comb frame 65, shown in FIG. 13 have grooves or slots 68 for receiving and holding wafers 54.

Figure 4:
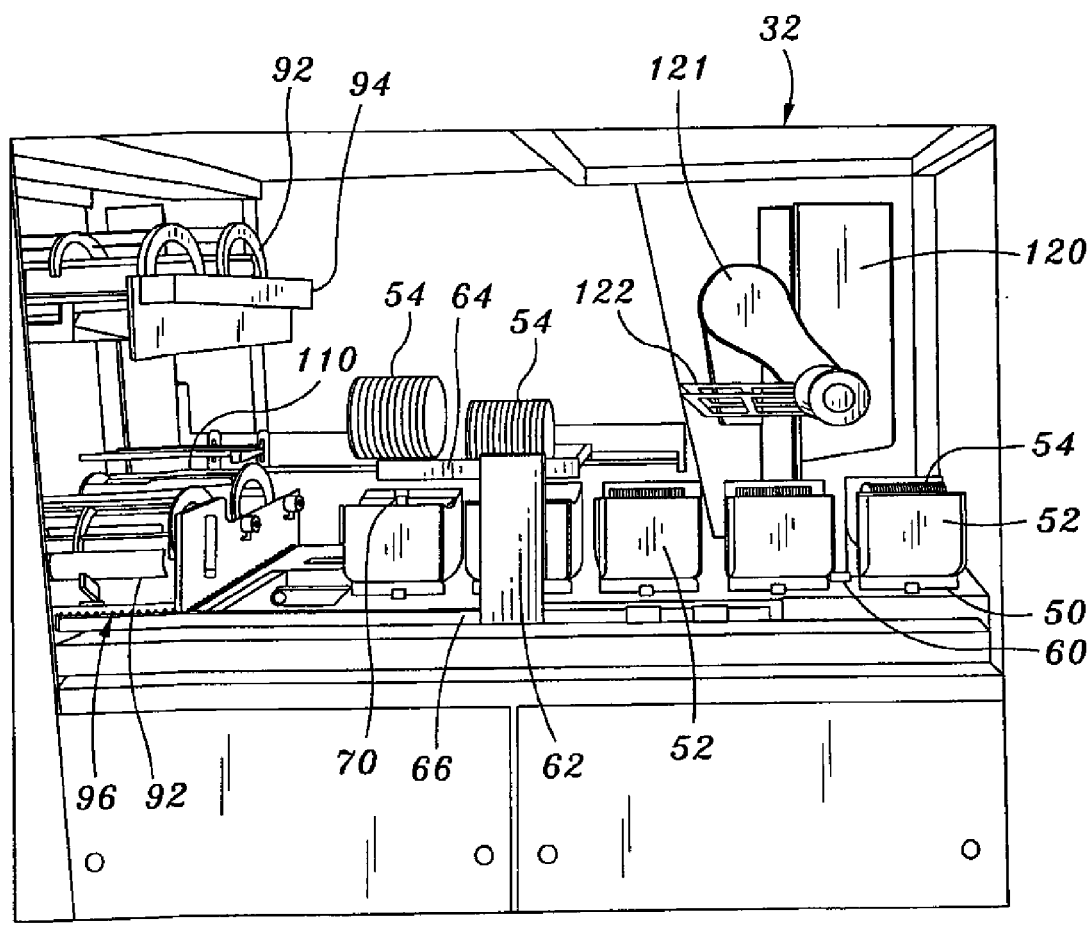
FIG. 4 is a side view thereof, with the indexer loaded, and showing transfer of wafers from the buffer elevator to the wafer combs of the buffer robot.

Referring to FIGS. 4 and 14, a buffer elevator assembly 70 has an elevator frame 72 attached to the system enclosure 34, or other structure below the interface section 32. Lift rods 76 extend through collars on the elevator frame 72. A lift drive motor 80 drives a ball screw 78, to raise and lower the lift rods 76. Referring to FIGS. 14 and 15, a tray head 74 is supported on top of each of the lift rods 76. A tray 82 is attached to each tray head 74 via a dove tail 83. The trays 82 have grooves 84, for receiving and holding wafers 54.

Figure 19:
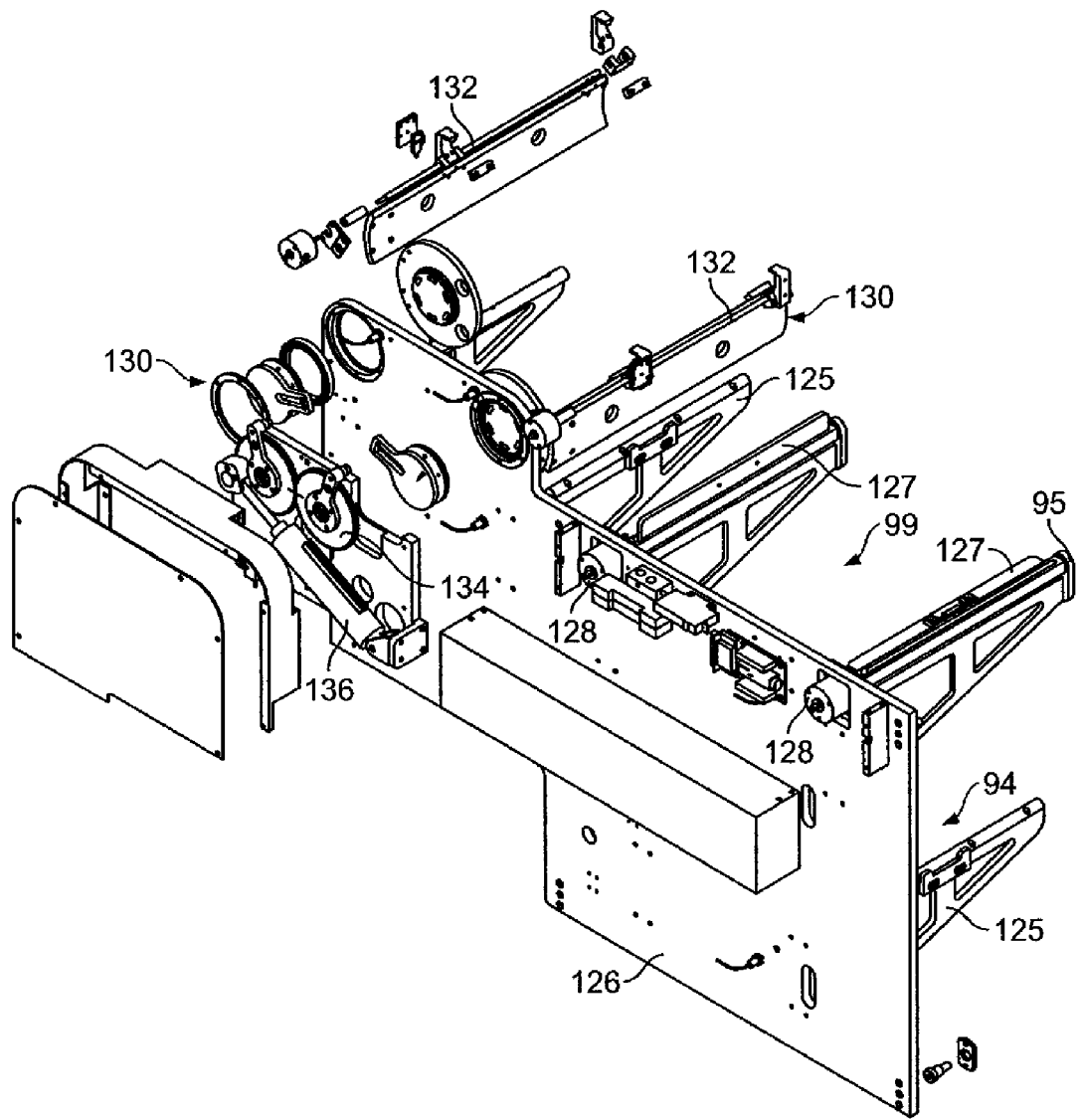
FIG. 19 is a front exploded perspective view of the carrier gate or retainer operator subsystem shown in FIGS. 6–10.
Figure 20:
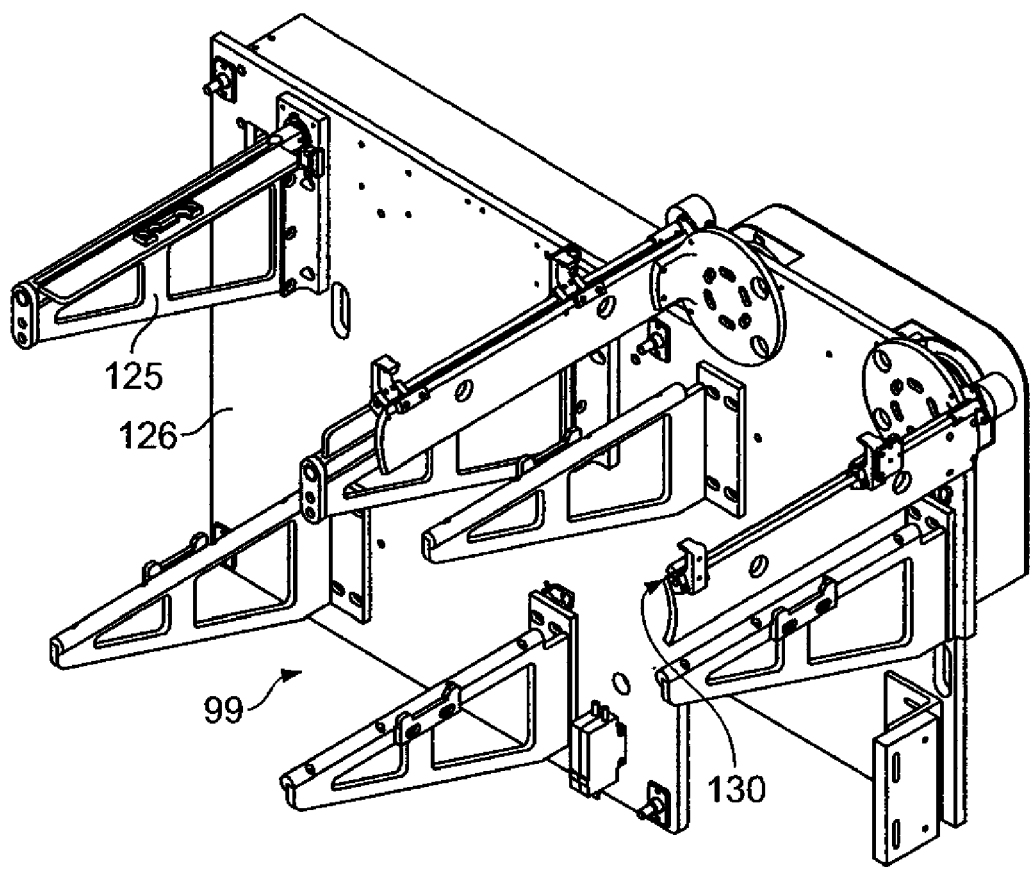
FIG. 20 is a rear perspective view of a carrier shelf and the carrier gate opener as shown in FIGS. 6–9 and 19.

Turning now to FIGS. 6–10, a carrier loader subsystem 90 loads wafers 54 from the buffer robot 62 into carriers 92. The carrier loader 90 includes carrier holders or shelves 94 forming carrier storage positions 99. As shown in FIGS. 19 and 20, the carrier holding or storage positions 99 are formed by arms 95 of the shelves 94. Each arm 95 has a gusset 125 fixed to a support plate 126. A flange 127 is pivotably attached to the gusset 125, and is movable via an actuator 128 between an up position (as shown in FIG. 20) and a down position (as shown in FIG. 19).

Referring to FIGS. 6–10 and 18, a carrier robot 100 includes a lift rail 101 extending vertically alongside the carrier holding positions 99. A lateral arm 106 is vertically movable along the lift rail 101, via a ball screw or similar actuator. A carrier armature 111 is movable on a armature rail 116 on the arm 106. The armature 111 includes a fixed lower hook 113 and upper hook 115 pivotable via an upper hook actuator 117. With lateral movement of the armature 111 on the rail 116 and pivoting movement of the upper hook 115, the armature 111 can engage or pick up a carrier 92, by holding the front ring of the carrier between the hooks 113 and 115, to move carriers 92 between holding positions 99.

Figure 17:
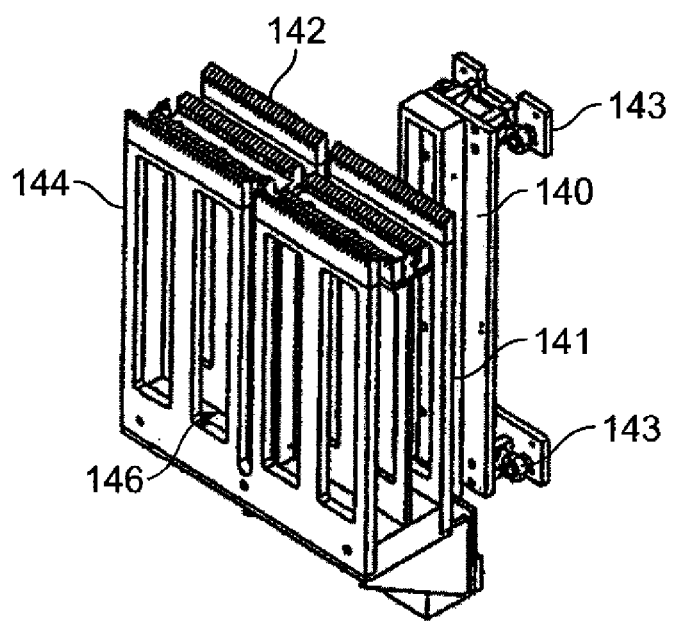
FIG. 17 is a perspective view of the carrier load comb robot shown in FIGS. 8 and 9.

Referring to FIGS. 6–9 and 17, a carrier loading elevater, or a comb lift elevator 140 is positioned under a carrier load position 96 at the carrier robot 100. Referring to FIG. 17, the comb lift elevator 140 has comb heads 142 supported on risers 144 on a base 146. A lift mechanism 141 in the comb lift elevator 140, such as a ball screw, raises and lowers the base 146. The mounting plates 143 of the comb lift elevator 140 are attached to the enclosure 34 or other structure adjacent to the the carrier load position 96.

Figure 22:
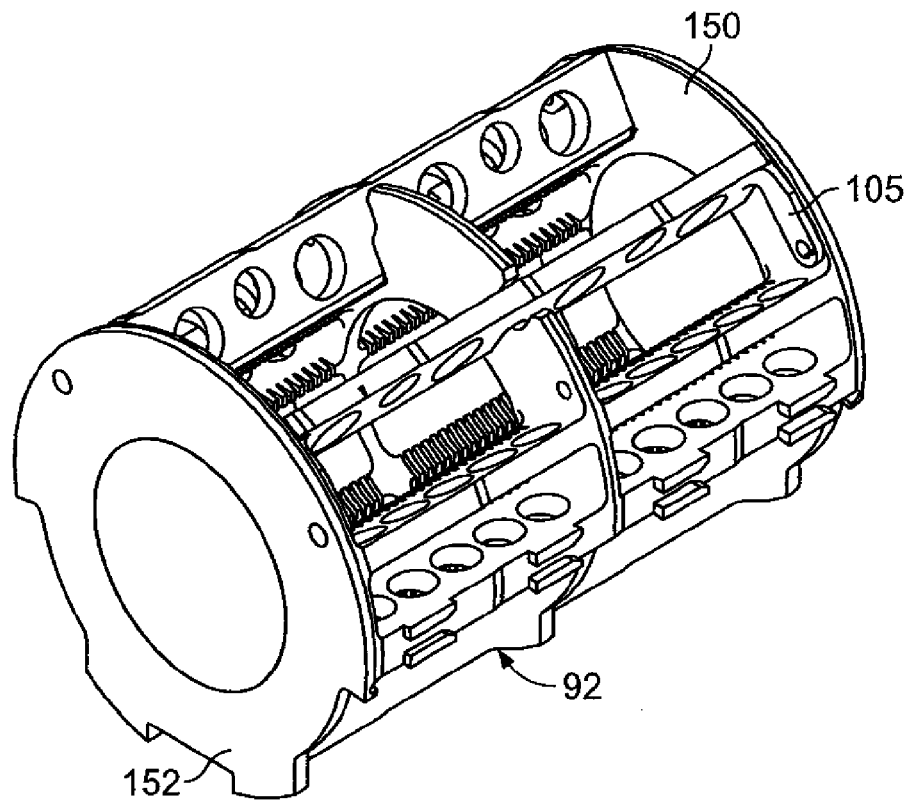
FIG. 22 is a front and top perspective view of a carrier as shown in FIGS. 4–11.
Figure 23:
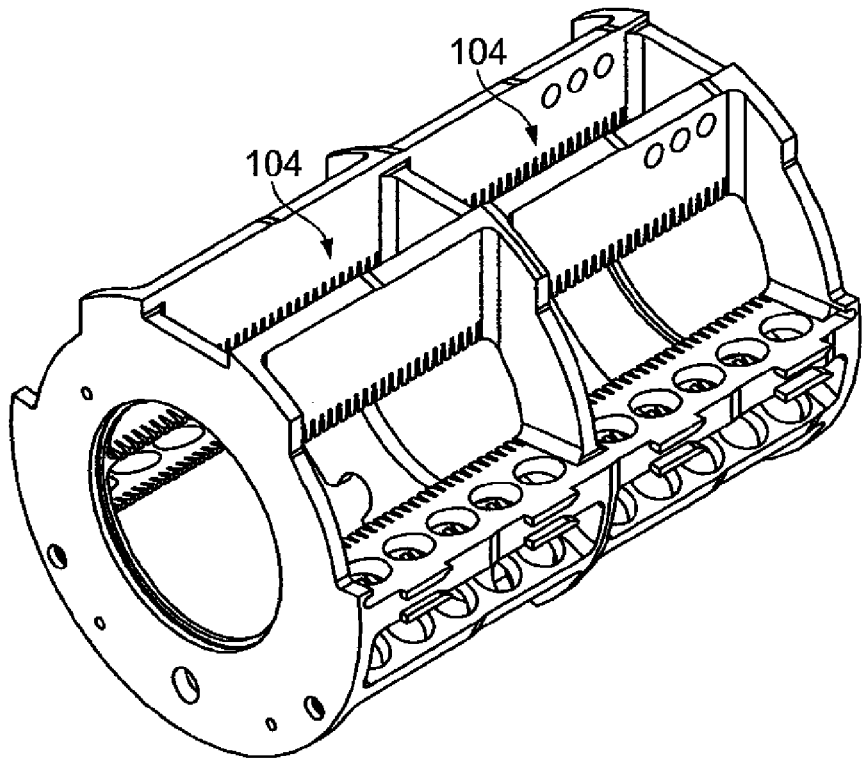
FIG. 23 is a bottom perspective view thereof.

Referring to FIG. 22, the carrier 92 has gates or retainers 105 pivotably supported on the front and rear carrier rings 150 and 152. The gates are movable to an open position, for loading and unloading wafers into and out of the carrier 92, and to a closed position, for carrier movement and processing. The carrier 92 is described generally in U.S. Pat. No. 6,536,131, incorporated herein by reference. In addition, as shown in FIG. 23, the carrier 92 has a rectangular through opening 104. The opening 104 is dimensioned to allow the comb heads 142 to pass entirely up through the carrier 92, during loading and unloading. The riser 144 is tall enough so that the comb heads lift the wafers up off of the buffer robot, before the base 146 contacts the bottom of the carrier 92. As shown in FIGS. 22 and 23. the front ring 150 is attached to the rear ring 152 via ribs or bars. Combs having rows of comb teeth separated by slots are formed on the inside surfaces of the ribs. The front ring, rear ring, and ribs generally form a cylinder or a generally cylindrical carrier, with the opening extending through the carrier in a direction perpendicular to the axis of the cylinder.

Referring to FIG. 19, a gate opener assembly 130 has gate drivers 132 connected to a Geneva mechanism 134 driven by an actuator 136. Hooks 138 on the gate drivers engage and open and close the gates 105 on the carrier 92.

Figure 8:
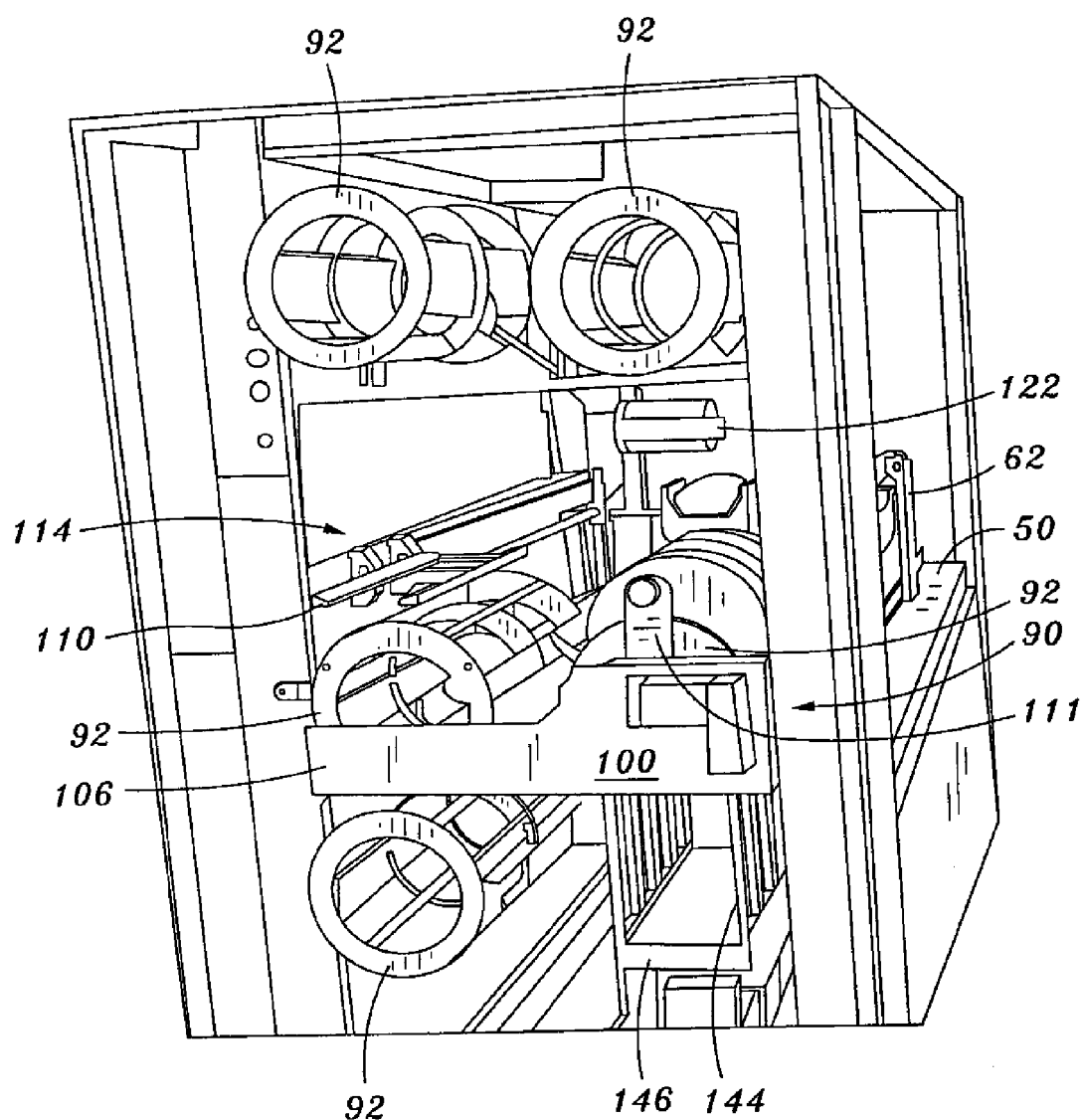
FIG. 8 is a similar perspective view showing the carrier load comb lowering the wafers down into the carrier, and showing the shuttle robot in the rear position.
Figure 10:
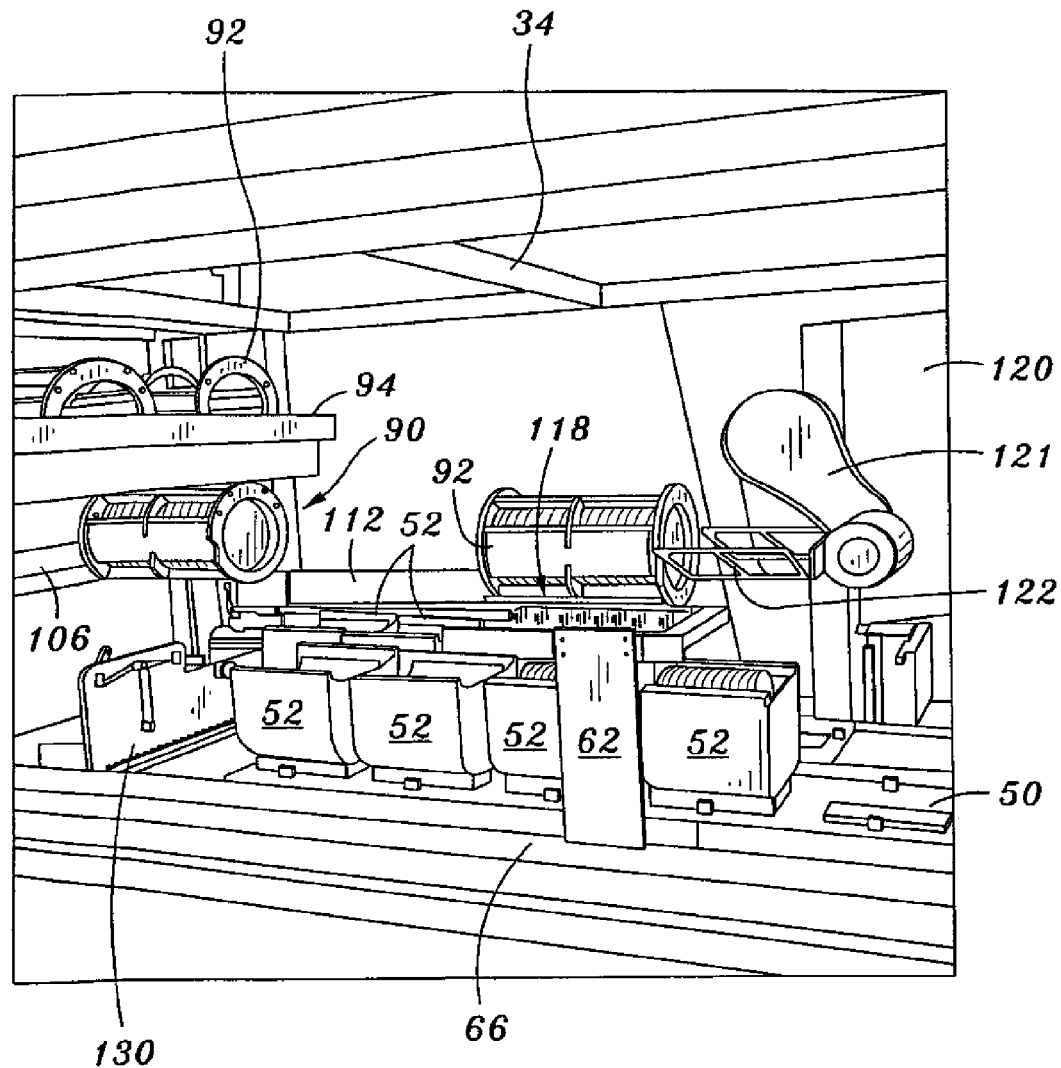
FIG. 10 is a side perspective view showing the loaded carrier on the shuttle robot at the front position, with the process robot ready to engage the loaded carrier and lift it off of the shuttle robot.
Figure 21:
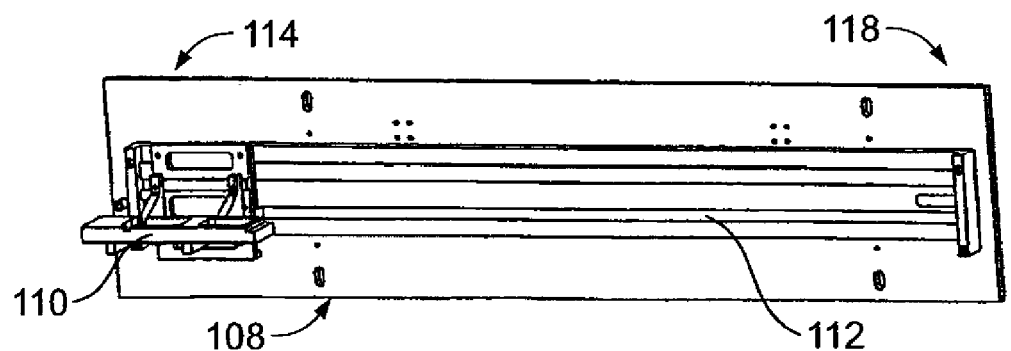
FIG. 21 is a side and front perspective view of the shuttle robot shown in FIGS. 8, 10 and 11.

Referring now to FIGS. 8, 10 and 21, a shuttle robot 108 has a carrier platform 110 movable along a shuttle rail 112. The shuttle rail 112 extends alongside and parallel to the indexer 50. The shuttle rail 112 extends from a rear carrier transfer position 114, to a front carrier transfer position 118.

Turning now to FIGS. 2–5, 10 and 11, a process robot 120 is movable laterally on a process robot rail 124 between the interface section 32 and the process section 40. The process robot 120 has an articulated arm 121. A carrier end effector or hand 122 is provided on the end of the robot arm 121. The end effector 122 is adapted to engage and hold carriers 92, as described in U.S. patent application Ser. No. 09/612,009, incorporated herein by reference. Via movement of the process robot 120 along the rail 124, and with movement of the robot arm 121, a carrier 92 loaded with wafers 54 and held by the end effector 122 can be placed into and removed from the process chambers 42 and 44 from the forward shuttle transfer position 118.

In use, the window 37 is lowered, creating an access opening in the enclosure 34, during loading and unloading of cassettes 52. Cassettes 52 holding wafers 54 are loaded into the system 30 at the robotic loader 36. The cassettes 52 are moved to the loader 36, either by hand, or via a facility robot. The robotic loader 36 moves the cassettes 52 onto the indexer 50. The indexer moves the cassettes in the first row 56 rearwardly to the buffer elevator position. The indexer is described in U.S. Pat. No. 6,279,724, incorporated herein by reference. FIGS. 3 and 4 illustrate the sequence of movement of the cassettes 52 on the indexer 50.

Figure 5:
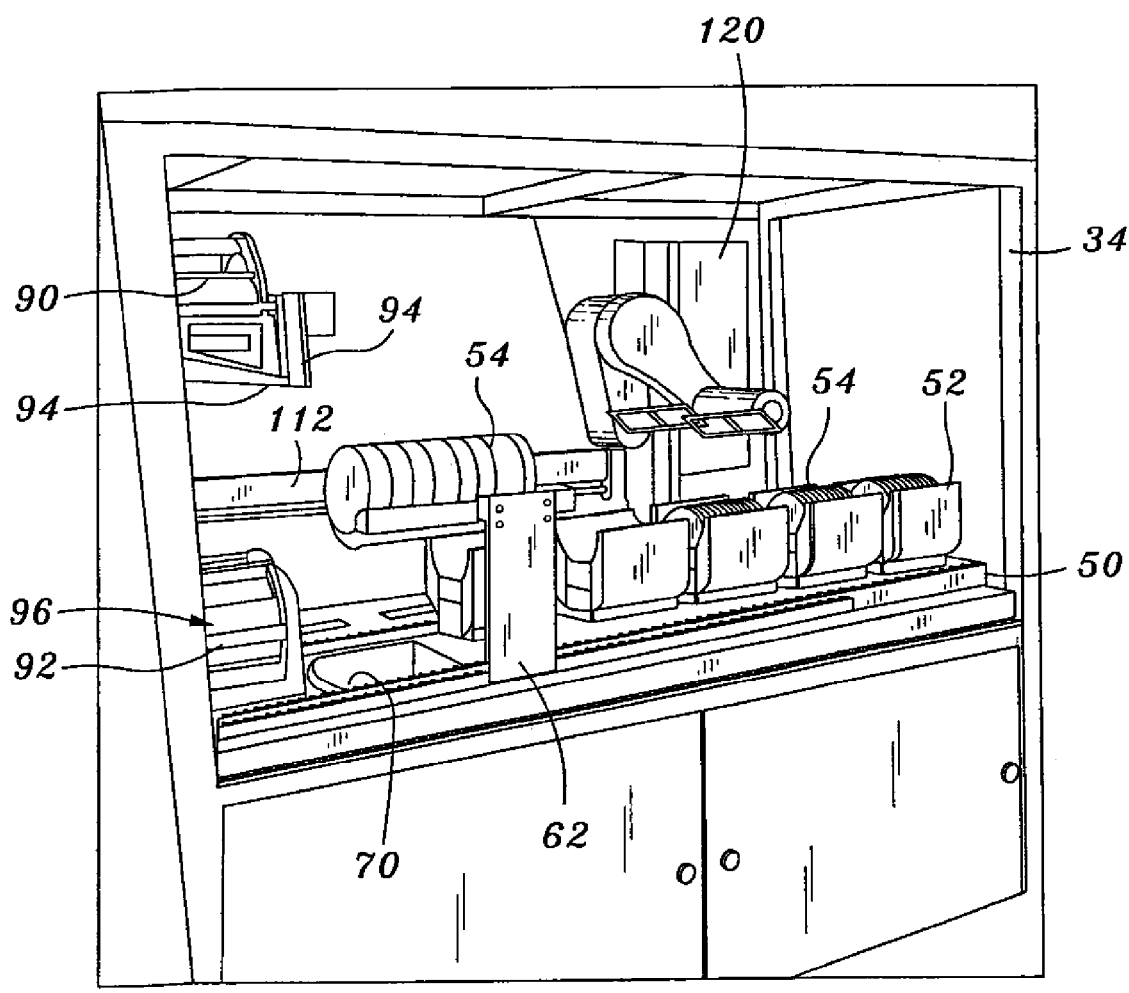
FIG. 5 is a rear and left side perspective view thereof, showing the next step in sequence of operation, with two batches of wafers now transferred to and held by the buffer robot.

With a cassette 52 of unprocessed wafers 54 at the buffer elevator position, the buffer elevator lifts up through clearance openings in the cassette platforms 60 and the cassette 52. The grooves 84 in the trays 82 align with the wafers 54, and lift the wafers 54 out of the cassette, as shown in FIG. 4. The buffer robot 62 moves rearwardly to a position underneath the elevated wafers 54. The buffer or workpiece elevator 70 then lowers the wafers, which come to rest in the buffer wafer combs 64 of the buffer robot 62. The buffer elevator 70 then retracts or returns to the down position, as shown in FIG. 5.

Figure 6:
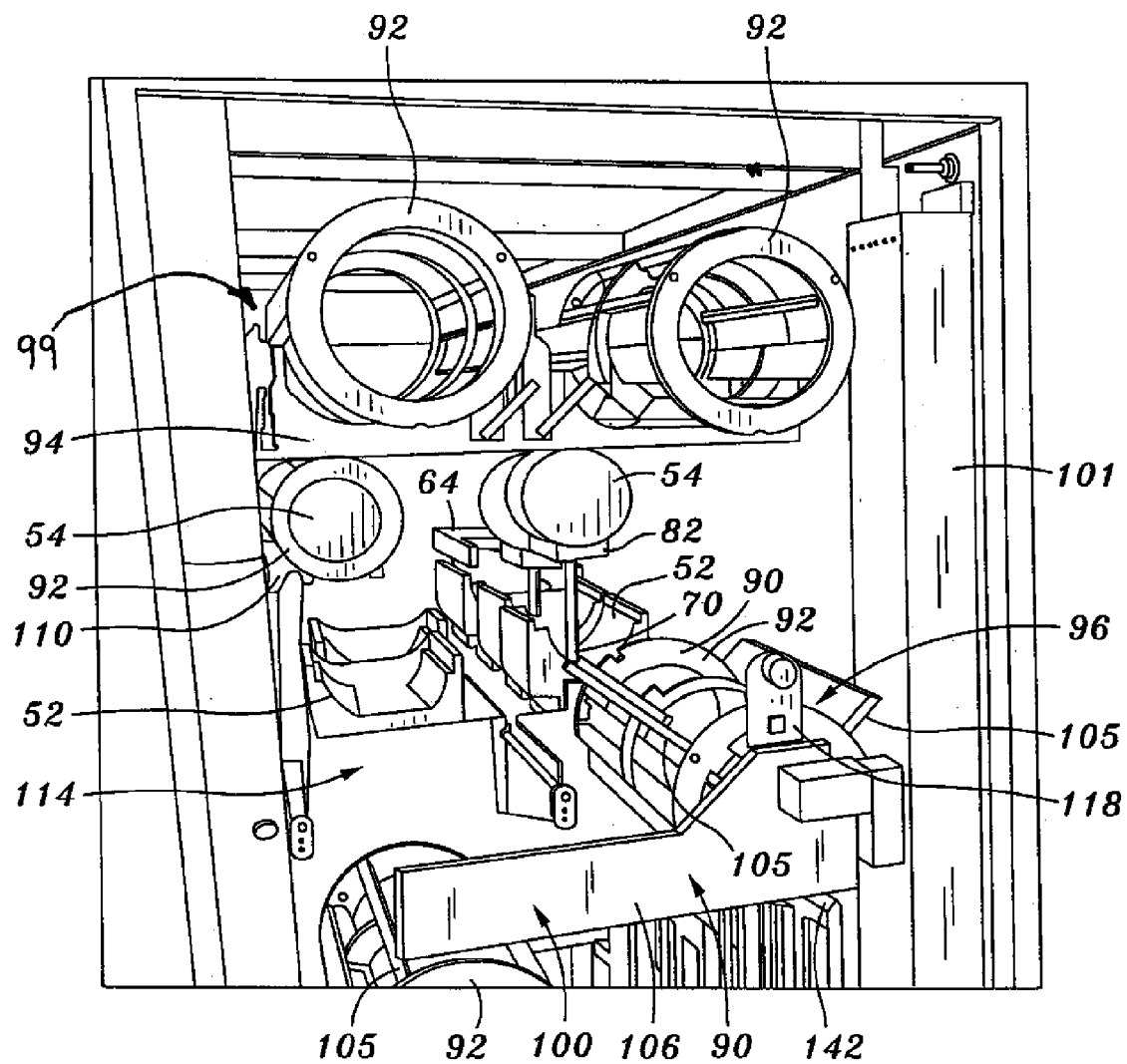
FIG. 6 is a rear perspective view of the interface section showing two batches of wafers on the buffer elevator ready for transfer to the buffer robot, and showing a carrier at the carrier loading position, with the carrier retainers or gates open.
Figure 7:
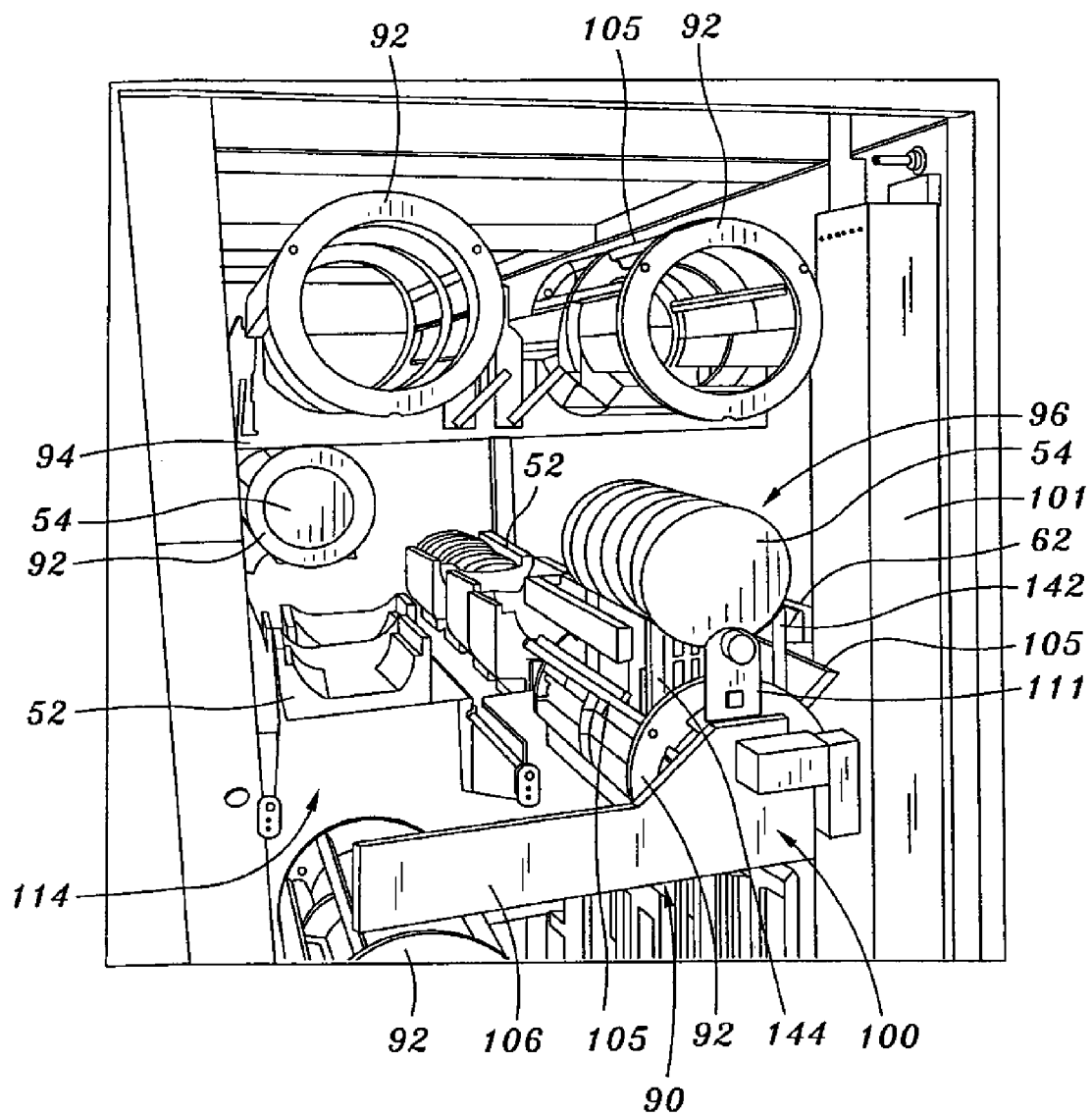
FIG. 7 is a similar perspective view showing the buffer robot over the carrier loading position, and with the carrier load combs extended up through the carrier, to lift the wafers off of the buffer robot combs.

Referring to FIGS. 6 and 7, the gate or retainer driver 130 opens the retainers 105 on a carrier 92 at the carrier load position 96, as shown in FIG. 6. The buffer robot holds the wafers 54 directly vertically above the carrier 92. The comb lift elevator 140 lifts the comb heads 142 up and through the open carrier 92, to lift the wafers 54 off of the buffer robot 62, as shown in FIG. 7. The buffer robot 62 then withdraws or returns to a position in front of the buffer elevator 70.

The comb lift elevator 140 then reverses direction, lowering the wafers 54 into the carrier 92. As the wafers 54 are wider, or have a diameter greater than the combs within the carrier 92, the wafers 54 are contained within the carrier, as the comb heads 142 continue to move down and out of the carrier 92. The retainer driver 130 then closes the retainers 105.

Figure 9:
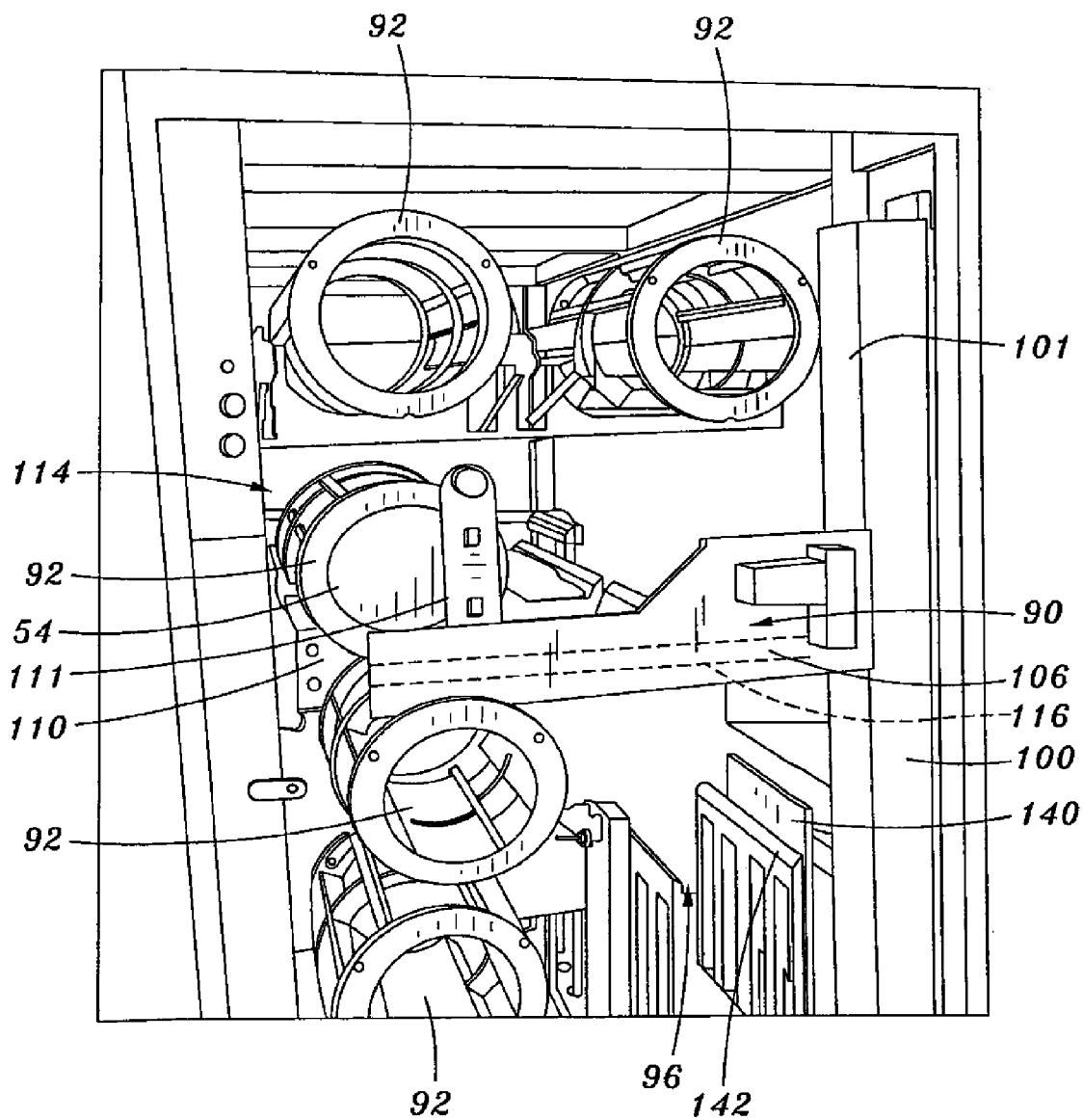
FIG. 9 is a similar perspective view, continuing to show the next step in sequence, wherein the carrier loader robot has moved the loaded carrier from the carrier loading position, onto the shuttle robot.

The carrier robot 100 then moves to engage the loaded carrier 92. Specifically, the lateral arm 106 is vertically positioned on the lift rail 101 to vertically align the hooks 113 and 115 of the armature 111 with the rear ring 152 of the carrier 92. The armature 111 is then moved laterally to engage the rear ring. After the rear ring of the carrier 92 is engaged, the upper hook 115 is pivoted downwardly by the upper hook actuator 117, thereby securing the armature onto the carrier 92. The lift rail 101 then lifts the carrier 92 up from the carrier load position 96. As shown in FIGS. 8 and 9, via movement of the lateral arm 106 on the lift rail 101, and via movement of the armature 111 on the lateral arm 106, the loaded carrier 92 is moved onto the shuttle platform 110 of the shuttle robot 108.

Figure 11:
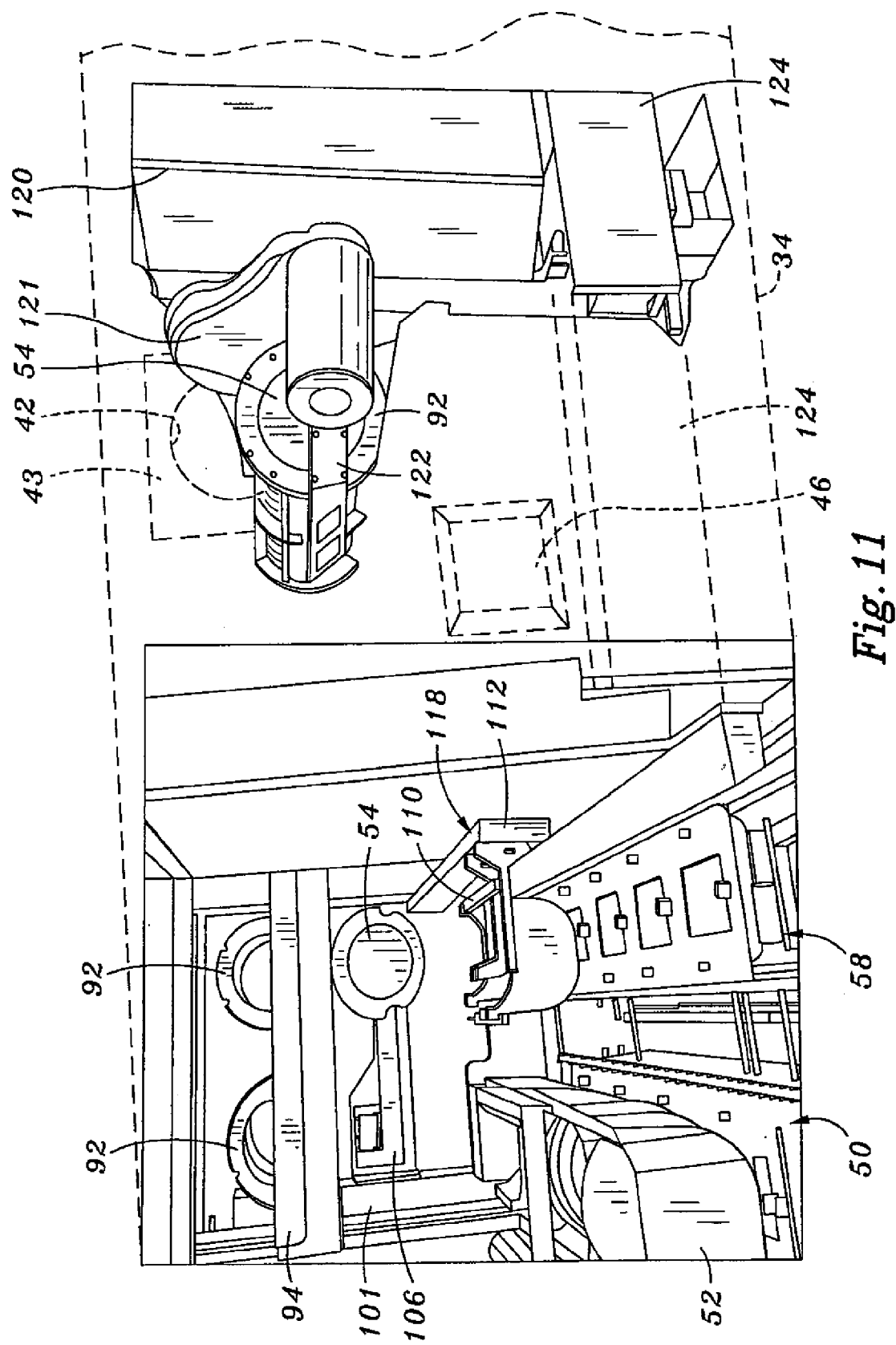
FIG. 11 is a front perspective view showing the process robot moving the loaded carrier to a process chamber or station.
Figure 12:
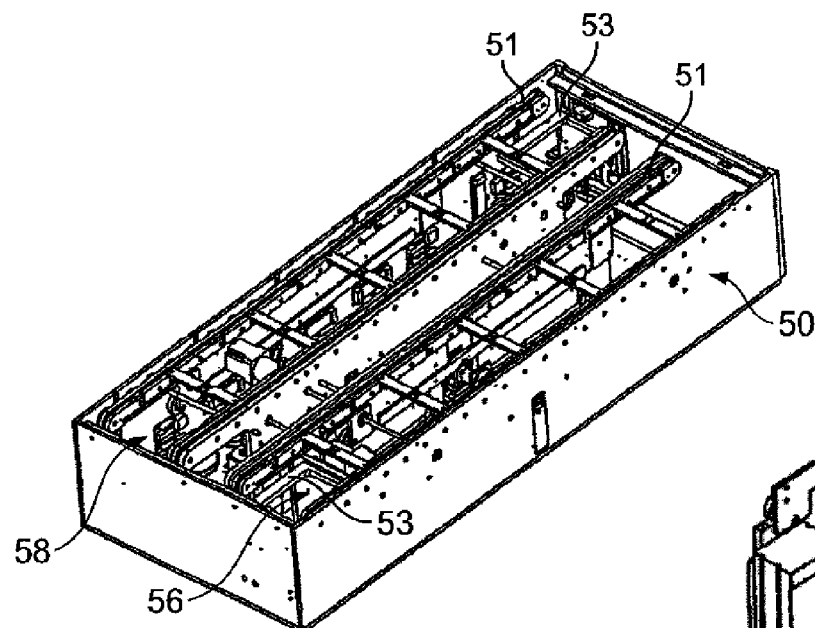
FIG. 12 is a perspective view of the indexer, with the container or cassette support plates removed, for purpose of illustration.
Figure 18:
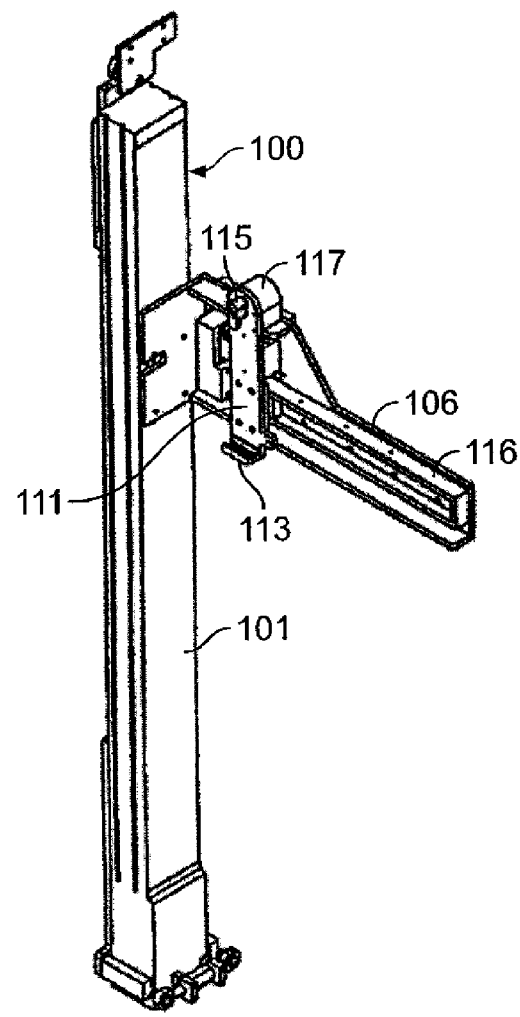
FIG. 18 is a front and top perspective view of the carrier loader robot shown in FIGS. 6–9.

As shown in FIG. 10, the shuttle robot 108 moves the loaded carrier 92 forward from the rear transfer position 114, to the front transfer position 118. As shown in FIGS. 10 and 11, the end effector 122 of the process robot 120 engages the loaded carrier 92 and lifts the carrier off of the shuttle platform 110. The shuttle robot 110 then moves laterally on the rail 124, to place the carrier 92 containing the wafers 54 into one of the process chambers 42 and 44.

Simultaneously, or subsequently, additional cassettes 52 are moved via the indexer 50, buffer elevator 70, buffer robot 62, comb lift elevator 140, carrier robot 100 and shuttle robot 108, using the same movements described above.

Following processing of the wafers 54 in the process chambers, the process robot 120 removes the carrier 92, and returns the carrier 92, now containing processed wafers 54 to the shuttle platform 110. The carrier 92 is then returned to the carrier loader 90. The processed wafers are removed from the carrier 92 and placed into a cassette 52, using the reverse sequence of movement. The cassette containing processed wafers moves forward through the second row 58 of the indexer 50. The robotic loader 36 moves the cassette to the window 37, for removal from the system 30.

Figure 16:
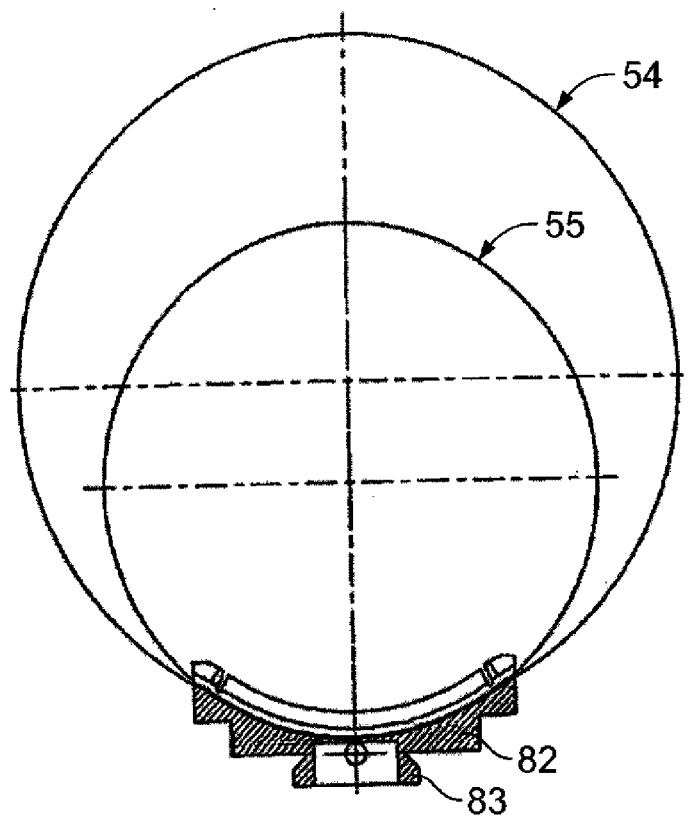
FIG. 16 is a front view of alternate size wafers on the tray shown in FIG. 15.

Referring to FIG. 16, the tray 82 has grooves adapted to receive and hold wafers of varying size, for example, 200 mm and 150 mm diameter wafers.

Thus, a novel handling and process system has been shown and described. It will be apparent that various changes and substitutions may be made, without departing from the spirit and scope of the invention. The invention, therefore, should not be limited, except by the following the claims, and their equivalence.

The invention claimed is:

1. A workpiece handling system comprising:
a workpieoe elevator positioned for moving workpieces substantially vertically up and out of a workpiece container;
a carrier loader including a carrier gate opener, a carrier loading elevator, and a plurality of carrier shelves having a plurality of carrier holding positions, and a carrier loader robot movable to substantially each of the carrier shelves, and the carrier loader robot having a carrier engager, adapted to engage and hold a carrier;
a buffer robot moveable between the workpiece elevator and the carrier loading elevator;
a carrier at one of the plurality of carrier holding positions, with the carrier having a side opening and one or more workpiece retainers moveable between open and closed positions via the carrier gate opener, and with the carrier loading elevator moveable vertically through the side opening of the carrier, for loading and unloading workpieces into and out of the carrier.

2. The system of claim 1 further comprising a carrier shuffle moveable in direction parallel to movement of the buffer robot.

3. A workpiece handling system, comprising:
an indexer for moving a plurality of cassettes among a plurality of cassette holding positions;
a first elevator moveable vertically through the indexer to lift a batch of workpieces up and out of a cassette;
a carrier loader having a carrier load position and a plurality of carrier holders, and a carrier loader robot movable from the carrier load position to substantially each of the carrier holders;
a generally cylindrical workpiece carrier supported by the workpiece carrier holder;
a second elevator moveable vertically through an opening in the workpiece carrier, to load or unload workpieces into and out of the workpiece carrier;
a buffer robot moveable from the first elevator to the second elevator;
a carrier shuttle extending alongside the indexer, for moving a carrier from the carrier loader to a carrier transfer position;
one or more spin/spray process chambers each having a rotor, with the carrier engageable into the rotor; and
a process robot movable in a direction generally perpendicular to movement of the carrier shuttle, for moving a carrier from the carrier transfer position to a process chamber.

* * * * *